US006856921B2

(12) United States Patent
Cohen et al.

(10) Patent No.: US 6,856,921 B2
(45) Date of Patent: Feb. 15, 2005

(54) ADAPTABLE HEAT DISSIPATION DEVICE FOR A PERSONAL COMPUTER

(75) Inventors: Mark E. Cohen, Cary, NC (US); Joseph Anthony Ho-Lung, Wake Forest, NC (US); Vinod Kamath, Raleigh, NC (US); Leo Harold Webster, Jr., Cary, NC (US); Tin-Lup Wong, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/732,157

(22) Filed: Dec. 10, 2003

(65) Prior Publication Data

US 2004/0122606 A1 Jun. 24, 2004

Related U.S. Application Data

(62) Division of application No. 09/591,011, filed on Jun. 9, 2000, now Pat. No. 6,445,580.

(51) Int. Cl.⁷ .......................... G01R 2/00; G06F 19/00; G06F 1/20
(52) U.S. Cl. ........................ 702/60; 361/687; 361/700; 700/295; 702/132
(58) Field of Search .............................. 702/44, 60, 61, 702/63, 64, 107, 132; 713/300, 320, 322, 323; 700/295; 607/105; 361/685–687, 700; 374/43, 126; 322/45; 136/201

(56) References Cited

U.S. PATENT DOCUMENTS

| 5,600,575 | A | * | 2/1997 | Anticole | 702/132 |
| 5,898,569 | A | * | 4/1999 | Bhatia | 361/700 |
| 6,167,330 | A | * | 12/2000 | Linderman | 700/295 |
| 6,463,396 | B1 | * | 10/2002 | Nishigaki | 702/132 |

* cited by examiner

*Primary Examiner*—John Barlow
*Assistant Examiner*—John Le
(74) *Attorney, Agent, or Firm*—Joscelyn G. Cockburn

(57) ABSTRACT

A cooling apparatus, method and article of manufacture are disclosed which provide for selectively providing power to an attached heat-dissipating apparatus having a cooling probe in thermal contact with a cooling unit, to remove heat generated by a heat-generating source within the computer to an external environment outside of the computer. Power may be conserved, portable battery life extended, higher-speed processors utilized, and overall dimensional characteristics of a personal computer may be slimmed and reduced by utilizing the apparatus with a personal computer. Heat energy is transferred across a thermal connection interface from the heat-generating source of the personal computer to a collection face of the apparatus, and thereafter collected heat energy is dissipated in relation to the available power of the power source and/or the planned operating speed of the processor.

2 Claims, 6 Drawing Sheets

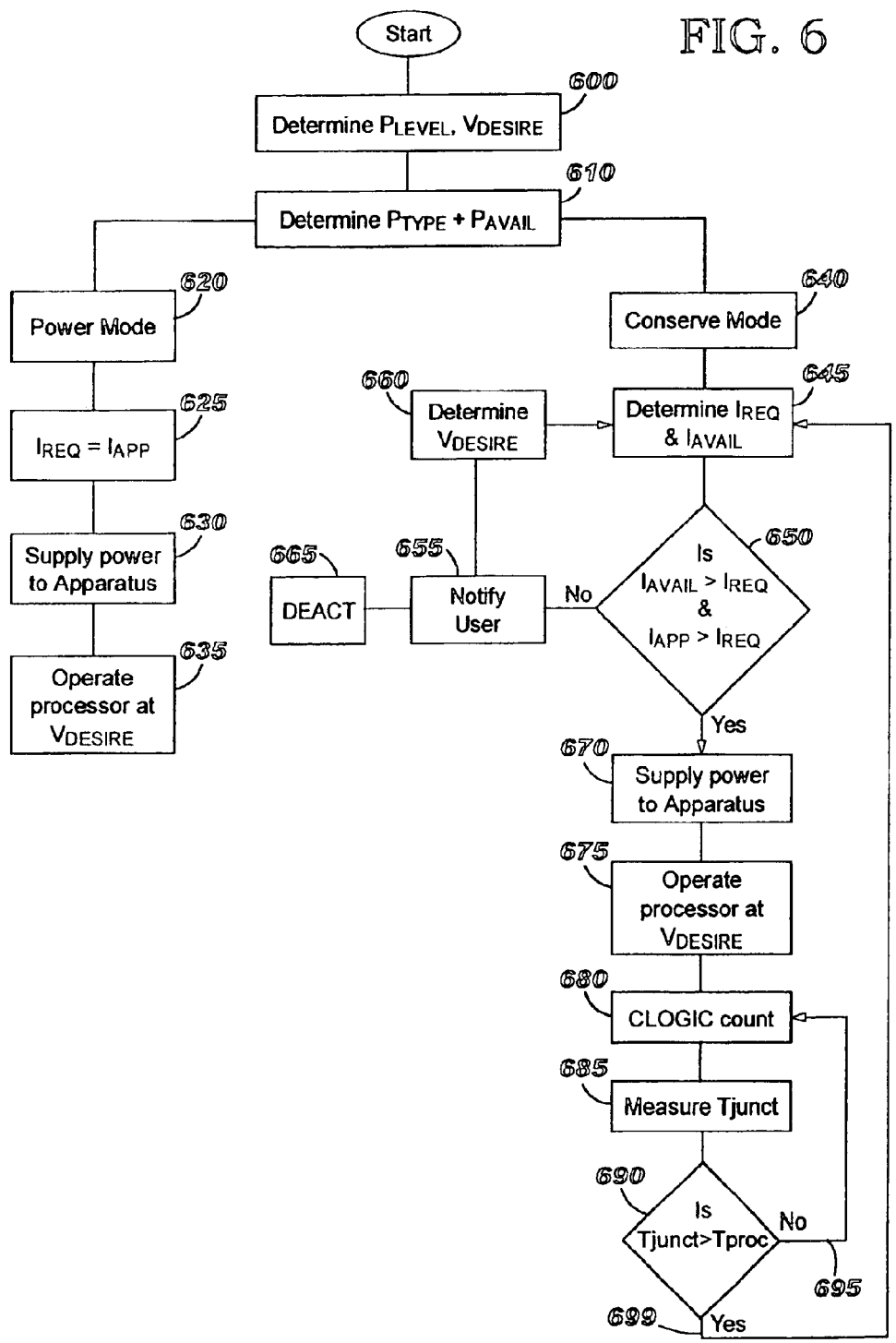

ADAPTABLE HEAT DISSIPATION DEVICE FOR A PERSONAL COMPUTER

This application is a division of application No. 09/591,011, filed on Jun. 9, 2000, now U.S. Pat. No. 6,445,580.

BACKGROUND OF THE INVENTION

1. Field of the Invention

The present invention relates to personal computers, and more particularly to devices and methods for conductively dissipating heat generated from operational internal electronic circuitry and/or components (e.g., microprocessors) of personal computers, to an environment external to the personal computer.

2. Description of the Related Art

Consumers typically prefer to obtain personal computers (PCs) having a higher-speed processor, more compact dimension, improved portability, and/or an overall lighter weight (e.g., IBM® models 560, T20; IBM is a registered trademark of International Business Machines, Armonk, N.Y., USA). To meet demands, PC designers often strive to economically offer added computational functionality to model designs by integrating higher-speed processors and optimizing the internal platform, components, and/or operating systems to provide a consumer enhanced performance capabilities in a more compact model. Consequently, designers desire to better the overall portability and compactness of each PC model introduced.

In accordance with recent technical developments, various types of PCs, such as desktops, towers, laptops, notebooks, and portable types, have been developed and are being sold on the market. Additionally, other portable computer-based devices such as processor-based communicators and portable information terminals (PITs) (e.g., Personal Assistants, hand-held digital notepads, and Personal Digital Assistants (PDAs)) are also being developed and sold in the marketplace with similar consumer interest and demand. Critical in the design considerations for these processor-based devices is improving dimensional slimness, optimizing portability, minimizing the production cost, and reducing overall weight while integrating higher-speed processors to provide a user with additional functionality. In particular, efficiently removing heat energy generated by heat-generating components, power supplies and other sources within the device, has proved difficult but is required to ensure satisfactory operation of a higher-speed processor-based device.

As used herein, the term "personal computer" includes any electronic data processing device having a central processing unit (CPU) (e.g. microprocessor) including but not limited to devices such as: a computer, PC, computing device, communicator and PIT, wherein for the general purposes herein, it is desirable for such a device to be dimensionally portable.

As used herein, the term "eat-generating source" is any source within a personal computer which generates heat energy during its operation, including but not limited to an electrical element, electronic component, resident internal device, and power source.

However, it is known that as a processor's operating speed (i.e., frequency) increases so does the power consumption by (i.e., input power to the processor) and the surface temperature of the processor. As such, there is typically a substantial increase in the power required to operate a higher-speed processor and there is a need for additional cooling of heat generated by the processor over existing known methods to maintain the junction temperature of the processor to be within acceptable limits.

For example, an INTEL® mobile zPIII processor consumes approximately 12 Watts and has a junction temperature of 212 degrees Fahrenheit at its optimal operational frequency of 500 MHz (INTEL is a registered trademark of ITEL Corporation, Santa Clara, Calif., USA). An INTEL mobile PIII processor consumes approximately 20 Watts and has a junction temperature of 212 degrees Fahrenheit at its optimal operational frequency of 600 MHz. Analogously, it is believed that next-generation processors may operate at optimal processing speeds of about 1 Ghz and greater, and require approximately 25 Watts of power and greater, while having operational junction temperatures of about 212 degrees Fahrenheit.

To overcome the heat generated by a processor, an internal conventional cooling system (CCS) is often integrated within a personal computer to dissipate heat and cool the surface of the processor. For instance, it is known to air-cool a low-speed processor or deploy an internal heat sink apparatus such as a heat pipe to cool a mid-speed processor. With mid to high-speed processors, it is known to internally mount one or more thermoelectric cooling devices (TECs) which, as used herein, typically are solid state heat pumps based on the Peltier effect and also include but are not limited to motorized fans, fan sinks, heat sinks, spreader plates, heat pipes, Peltier devices, and other similar conventional thermodynamic dissipating device, singularly or in combination, which operate to reduce the junction temperature of the processor by removing excess beat through conductive means. It is known that a CCS may comprise one or more TEC devices in a typical arrangement for dissipating heat from a heat-generating source (e.g., operating processor) for distribution within or external to the computer housing (e.g., internal environment).

Traditionally, precise thermal contact between the heat-generating component and a CCS is required for efficient heat transfer. In a conventional application, pressure mounts are often utilized to secure a surface of the CCS contact with a surface of the processor.

FIG. 1 shows an exemplary CCS 100 in which TEC 110 is mounted on processor 120 within housing 130 of personal computer 140., wherein heat is dissipated across internal ambient environment 150 of personal computer 140.

Typically, TEC 110 mounted on processor 120 collects heat generated by processor 120 and dissipates the collected heat to heat sink 160 wherein the heat sink thereafter dissipates the heated air within 150 or external to the computer 140 at 180 via a motorized fan 170. Since the amount of heat which may be dissipated is proportional to the size and location of the TEC and to the heat generated by the internal processor, often the dimensions of the TEC are increased to improve the amount of heat dissipated.

CCSs will likely prove inadequate in satisfactorily dissipating the additional heat generated by higher-speed processors, as there is often either insufficient free-space for heat dissipation within the personal computer and/or the cooling system components are undersized with respect to the thermodynamic characteristics of the higher-speed processor. It is also foreseeable that TECs and CCSs that are improperly sized or have inadequate air flow available, may fail due to increased condensation during operation within the personal computer. As a result, utilizing a CCS in certain slim computer designs having higher-speed processors may no longer be feasible and a CCS may not therefore provide adequate cooling for future slim personal computer designs having higher-speed processors.

Similarly, since CCSs continuously consume power from their personal computer host, the CCS's power consumption in combination with the added power demands from the higher-speed processor may either exceed the available power or detrimentally reduce the utilization of a portable power source. Increasing the available power from a portable power source is typically not a preferred solution since both size and weight of the power source would typically be increased.

Therefore, designers have often been limited in their ability to economically balance the physical size and weight of a personal computer with the increased thermodynamic effects and power requirements of an integrated higher-speed processor. Consequently, designers may often attempt to resolve design issues by conducting one of the following less desirable design approaches: 1) increasing a casing's dimensions to account for increased thermodynamic effects and power requirements of a higher-speed processor; 2) minimizing changes to existing casing's dimension and portable power supply, thereby limiting the selection of an integrated higher-speed processor to reduced parameters (i.e., non-op zed processor having reduced functionality); 3) minimizing changes to existing casing dimensions by reducing functionality to reduce power (also known as "throttling") to the integrated processor such that the processor operates at a slower speed and generates less heat than at optimal speed; 4) adding costs to the personal computer by using more expensive materials, denser electronics and similar; or 5) a combination of any of the preceding approaches.

With the advent of higher-speed processors, it is projected that the overlap between the maximum operating temperature limit of the internal processors will exceed the temperature design margins of current compact personal computer designs. Similarly, with the projected increase in power requirements needed to operate the higher-speed processors, it is expected that the weight of the personal computer will increase, due to additional equipment, and that the placement of the additional equipment will virtually eliminate or exceed the available internal free-space. Additionally, since conventional heat dissipation techniques operate continuously, it is likely that the slim personal computer designs will be unable to accommodate higher-speed processors and CCSs without sacrificing dimensional compactness and portability. As a result, given the growing consumer demands to further reduce the dimensional size and weight of the personal computer while increasing functionality, integrating higher-speed processors into more portable and compact personal computer designs remains at risk.

SUMMARY OF THE INVENTION

Accordingly, due to the increased thermodynamic effects and power requirements a higher-speed processor in a personal computer presents, there is a need to develop a portable heat-dissipating apparatus which satisfactorily removes additional heat generated by an operational processor to an environment external to the personal computer without detrimentally impacting the dimensional characteristics of the personal computer. There is a further need to develop such an apparatus portable which is operatively coupled with and removably attachable to a personal computer such that the apparatus is selectively controllable to operate and dissipate heat in a power-conservation mode in relation to the processor's operational speed and the available power source.

According to one embodiment, of the present invention is a portable cooling apparatus, operable with a personal computer having a corresponding conductive connection in thermal contact with a heat-generating source within an ambient environment of the computer, comprising an adapter housing a cooling probe in thermal contact with a powered cooling unit, wherein when the adapter is mated at a connection interface with the conductive connection, generated heat energy is thermally transferred firstly from the conductive connection across the interface to the probe, secondly from the probe to the cooling unit, and lastly from the cooling unit to an external environment apart from the ambient environment.

According to another embodiment, the present invention is a portable cooling apparatus operably connected at a conductive connection interface to a personal computer having a corresponding conductive connection in thermal contact with a heat-generating source within an ambient environment of the computer, wherein the processor selectively controls power to energize or de-energize the apparatus according to the operational speed of the processor or an available power source such that generated heat energy is thermally transferred firstly from the processor across the interface to an external environment apart from the ambient environment.

According to another embodiment of the present invention, a method for selectively optimizing operation of a portable cooling apparatus attachable to a personal computer having a corresponding conductive connection in thermal contact with a heat-generating source within an ambient environment of the computer is provided, having the following steps: (a) determining power operational mode of processor in relation to power source, available power from the power source and planned operational speed of a processor of the personal computer; (b) calculating apparatus power required for dissipating heat energy theoretically generated by the heat-generating source at the planned operational processor speed, (c) determining to provide power to apparatus when available power is greater than apparatus power required, or adjust planned operational speed of processor to operate within determined power characteristics and providing power accordingly thereafter; (d) measuring actual junction temperature of the processor and comparing actual temperature with that theoretically determined in step (b); and, (e) adjusting the power to the apparatus in response to step (d) in relation to the determined power characteristics.

Advantageous features of the present invention over conventional cooling systems include the capabilities to: (1) selectively control or supplement the cooling of a processor in a personal computer prior to overheating of a processor; (2) selectively control the processor speed of a personal computer connected with the apparatus in relation to the available power; (3) reduce overall dimensions and/or weight of personal computers without impact to performance; (4) expand the operating temperature range limits of a processor; (5) provide additional space within a personal computer for additional performance improvements without impacting heat-dissipating means; (6) provide battery conservation and optimal utilization techniques; (7) provide utilization of more powerful processors in slim-design personal computers; (8) provide utilization of more powerful cooling devices with slim-design personal computers;

and (9) provide a method for safely dissipating heat energy from within a personal computer to an environment external to the computer.

BRIEF DESCRIPTION OF THE DRAWINGS

Other aspects, features, and advantages of the present invention will become more fully apparent from the following detailed description, the appended claims, and the accompanying drawings in which:

FIG. 6 is a method for optimally controlling power to an apparatus operationally coupled with a processor of a personal computer, in accordance with a preferred embodiment of the present invention.

DETAILED DESCRIPTION

The use of figure reference labels in the claims is intended to identify one or more possible embodiments of the claimed subject matter in order to facilitate the interpretation of the claims. Such labeling is not to be construed as necessarily limiting the scope of those claims to the embodiments shown in the corresponding figures.

Figure 1:
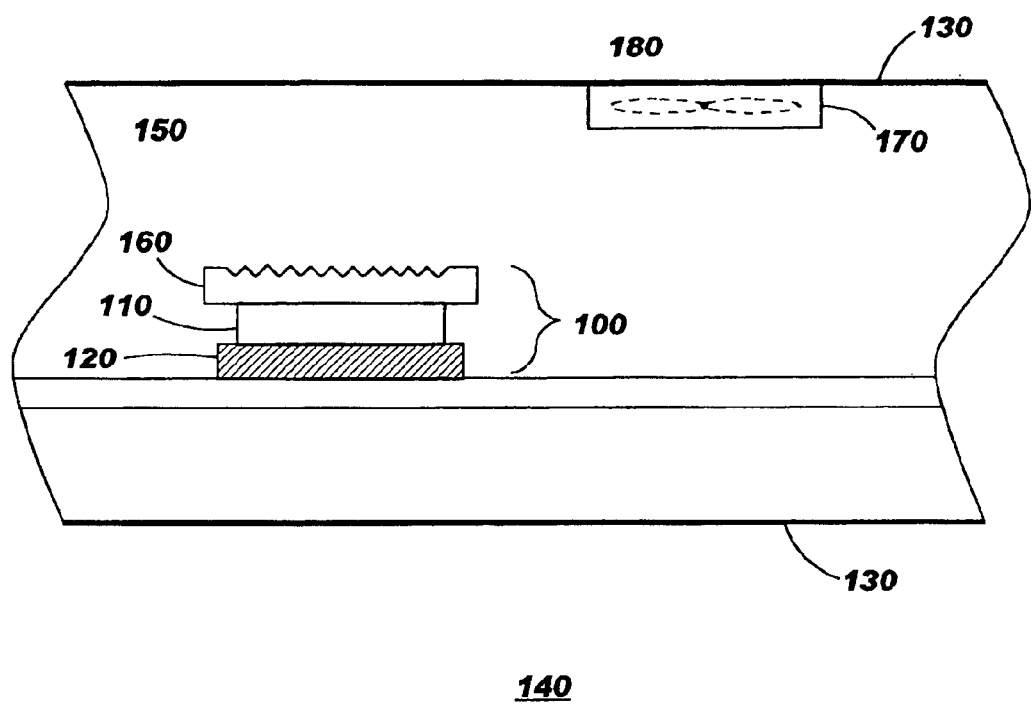
FIG. 1 shows an exemplary CCS in which a TEC is mounted on a processor within a housing of a personal computer, wherein heat is dissipated across an internal ambient environment of the personal computer.
Figure 2:
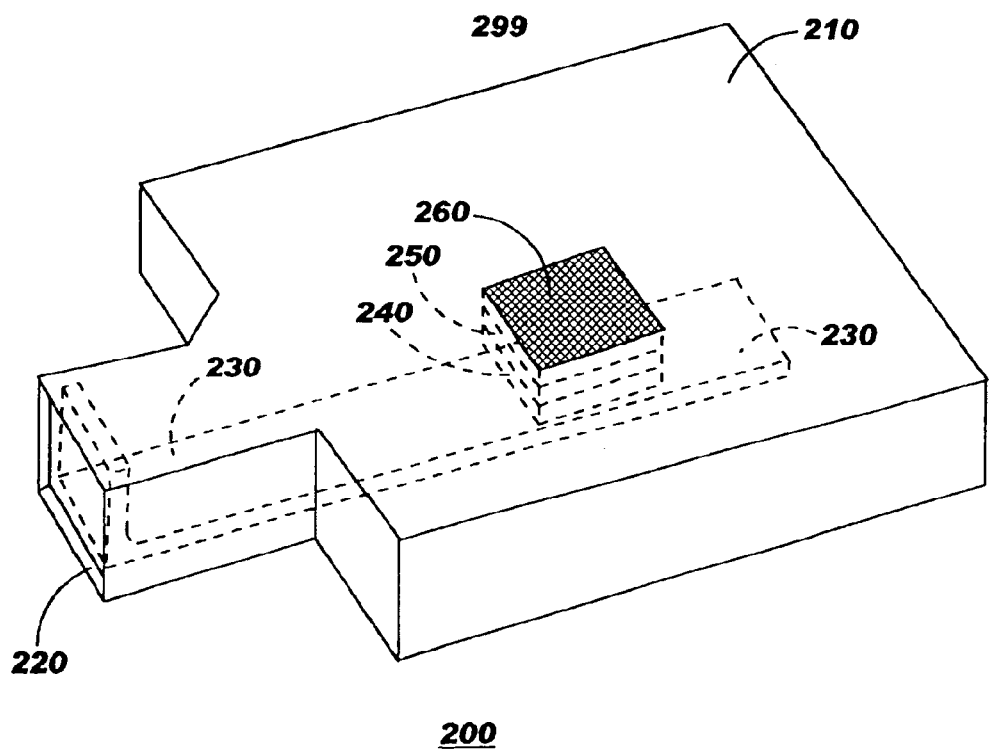
FIG. 2 is an exterior view of the apparatus in accordance with a preferred embodiment of the present invention.

FIG. 2 is an exterior view of apparatus 200 in accordance with a preferred embodiment of the present invention. Apparatus 200 has exterior housing 210, connection adapter 220, and houses conductive probe 230, thermo-electric cooler (TEC) 240, and heat sink 250. Optionally, a venting area 260 is integrated into the housing 210 to provide a direct exhaust outlet from the internal environment of apparatus 200 to external environment 299.

Figure 3:
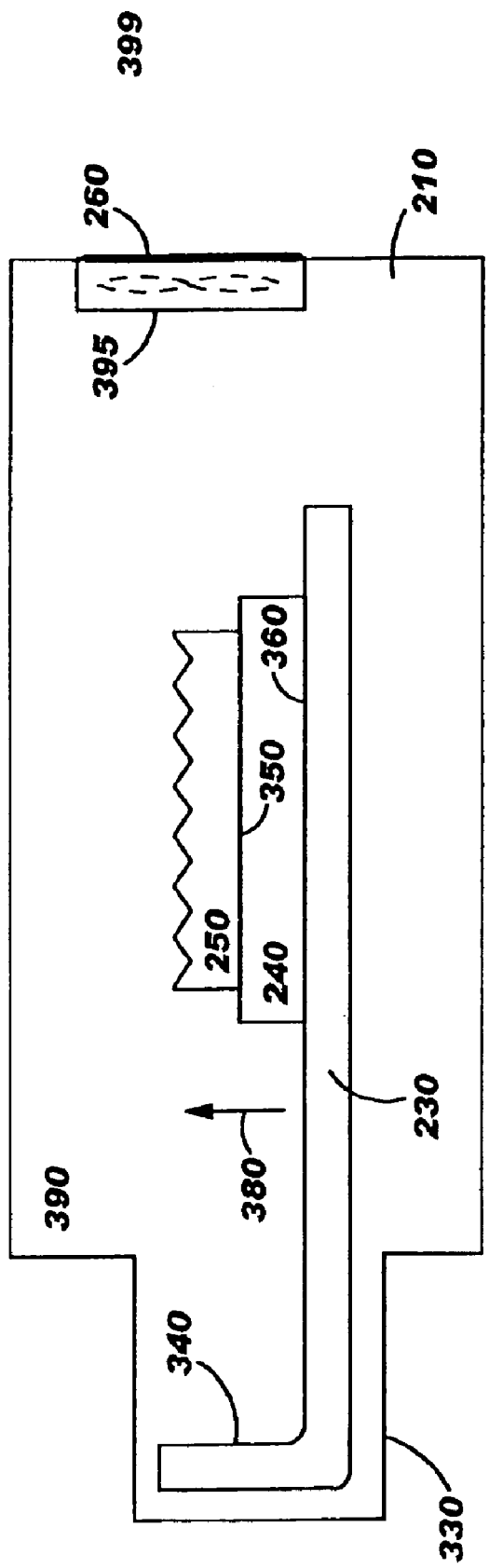
FIG. 3 is a first cross-section view of the apparatus of FIG. 2.

FIG. 3 is a first cross-section view of apparatus (200 of FIG. 2). Housed within apparatus 200 is conductive probe (230 of FIG. 2) thermoelectric cooler (TEC) (240 of FIG. 2) having a receiving face 360 and a conducting face 350, heat sink (250 of FIG. 2), and connection interface 330 housing surface face 340 of probe 230. Conductive probe 230 is comprised of a thermally-conductive material such as copper, and is fixedly mounted to expose surface face 340 at connection interface 330 for the collection and/or dissipation of heat energy from a separate heatsource (e.g. processor in a personal computer). When surface face 340 is in thermal contact with a separate heat-source, heat energy is conductively collected at the surface face 340 and is transferred from face 340 along the probe to the receiving lace 360. When power is applied from a power source (not shown) to TEC 240, a temperature difference (i.e., temperature gradient) is created across the TEC's two faces 350, 360 in relation to the amount of power applied to TEC 240. With power applied to TEC 240, receiving face 360 will have a surface temperature less than the surface temperature of conducting face 350. The heat energy is then thermally transferred from receiving face 360 to conducting face 350 as indicated by directional flow 380 after which the heat energy is exhausted to external environments via the heat sink 250 and optional fan 395. As used herein the term "external environment" is defined as an environment external to the internal ambient environment having a heat-generating source (e.g. a processor within a personal computer housing) and includes environments external to the housing of the personal computer such as an internal environment within the apparatus (390) and/or an atmospheric environment external to both a personal computer and the apparatus (399).

In operation, with power applied and a heat-generating source in thermal contact with surface ace 340, heat energy from the heat-generating source (not shown) is first conductively collected at surface face 340 and is then conductively transferred along probe 230 to receiving face 360. Heat energy is then transferred from receiving face 360 to conducting face 350 by electron transport, and is thereafter transferred within the apparatus environment 390. Heat energy is then transferred through an optional venting area (260 of FIG. 2) to external atmospheric environment 399 preferably by fan 395 which is fixedly mounted on housing 210 in proximity to venting area 260 to increase the rate at which heat energy is dissipated from heat sink 250 to either of the external environments 390, 399, although other dissipating devices are also envisioned by the inventor.

In a preferred embodiment receiving face 360 is conductively mounted with conductive probe 230 such that TEC 240 is positioned between the probe 230 and the heat sink 250. Alternatively or if concurrently, conducting face 350 is conductively mounted with heat sink 250 such that when power is applied to TEC 240, heat energy is conductively transferred from receiving face 360 to conducting face 350 by electron transport and is thereafter dissipated from heat sink 250.

Figure 4:
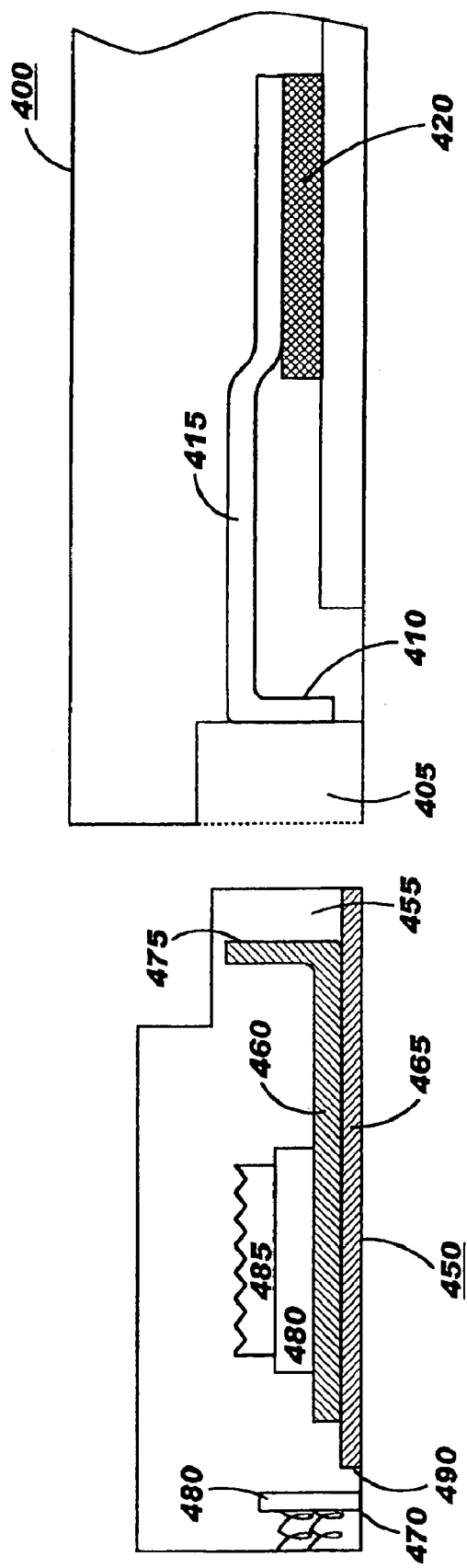
FIG. 4 is a diagram of an apparatus having a connection adapter and housing a slidable probe, and a personal computer having a corresponding receiving port, in accordance with a preferred embodiment of the present invention.

FIG. 4 is a diagram of personal computer 400 having a receiving port 405 corresponding to and aligned to be operably connected with connector adapter 455 of apparatus 450 which houses slidable probe 460, in accordance with a preferred embodiment of the present invention.

Personal computer 400 comprises corresponding receiving port 405, adapted to receive connection adapter 455, conductive face 410 which receives heat conductively transferred from heat generating device 420 along thermal conductive path means 415 when the heat-generating device 420 is operational. By way of example and not of limitation, conductive face 410 of conductive path means 415 is preferably integral to the path means and may include one or more of the following: spreader plate, heat pipe, heat exchanger, heat sink, wire, copper bar, etched circuit path, and/or other thermally-conductive device or material.

Slidable probe 460 is comprised of a thermally-conductive material such as copper and is slidably mounted along a corresponding locking means 465 affixed or a part of housing 470. By way of example and not of limitation, locking means 465 may include a plurality of tracks, rails, guides, edges, and similar features which provide both guidance and stability to probe 460 during positioning and placement of probe with corresponding receiving port 405. Slidable probe 460 also has surface face 475 and is in thermal contact with TEC 480 which is in thermal contact with heat sink 485. Slidable probe 460 is moveable along locking means 465 to provide predetermined alignment and contact pressure of surface face 475 with a receiving port 405. Optionally, a tensioned stopping means 480, such as a spring-backed plate, is positioned at a predetermined distance from a distal end 490 of the probe 460 to place surface face 475 in contact with a conductive face 410 conducting heat from a heat-generating source 420.

In operation, a user securably positions connection adapter 455 with receiving port 405. During this process, fixed conductive face 410 exerts a resistive force on slidable surface face 475 which thereby causes the slidable probe 460 to move along locking means 465 for a predetermined distance until stop spring 495 is compressed. When compressed, stop spring 495 exerts an opposing force on slidable probe 460 along distal probe end 490 until connection adapter 455 is securely positioned with receiving port 405. Once positioned, stop spring 495 continues to exert an opposing force on slidable probe 460 which thereby causes surface face 475 to be forcedly positioned in well-aligned, thermal contact with conductive face 410.

Figure 5:
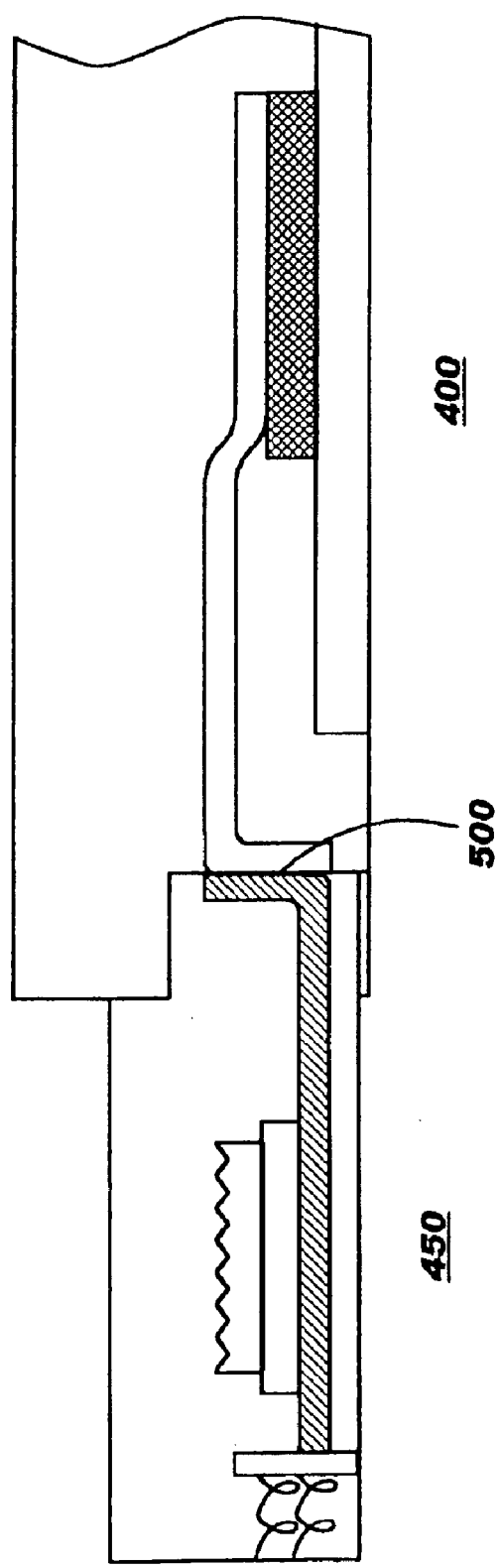
FIG. 5 is a diagram of the apparatus operationally coupled with a personal computer, in accordance with a preferred embodiment of the present invention.

FIG. 5 is a diagram of apparatus (450 of FIG. 4) operationally coupled at connection interface 500 with personal computer (400 of FIG. 4), in accordance with a preferred embodiment of the present invention. Apparatus 450 is removable from the computer 400 at the connection interface 500 by utilizing a release mechanism (not shown).

FIG. 6 is a method for optimally controlling power to an apparatus operationally coupled with a processor of a personal computer, in accordance with a preferred embodiment of the present invention. It will be recognized by those skilled in the art that the sequence of operations described herein may be performed under control or by a stored program, which may reside in on-processor or resident memory, software program, or hardware configured to perform the same. In a preferred embodiment, the method is accomplished by the processor performing one or more appropriate software routines. In step 600, the processor of the coupled personal computer determines the power utilization level of a connected apparatus and the desired operational speed of the processor.

The power utilization level ($P_{LEVEL}$) may be received from the apparatus in a message, or it may be calculated by the processor using a protocol, or it may be read from storage, or some other means. From the $P_{LEVEL}$, and known characteristics of the computer's power management system (PMS) and the apparatus' heat-dissipating components, a current range ($I_{APP}$) and associated thermal dissipation results ($T_{APP}$) for the apparatus can be calculated. Alternatively a table can be used to relate $P_{LEVEL}$ to the power controller state providing power to the apparatus.

The desired operational speed ($v_{DESIRE}$) may be received from a user by a software command, in a message, or it may be calculated by the processor using a protocol or default value, or it may be read from storage, or some other means. From $v_{DESIRE}$ and known characteristics of the computer's PMS and its heat-related components, an associated heat energy value ($T_{DESIRE}$) for an operational processor can be calculated. Alternatively a table can be used to relate processor speed to the surface temperature of the processor. In step 610, the processor determines the type of power source attached ($P_{TYPE}$) and the available power ($P_{AVAIL}$) of the attached power source.

When the $P_{TYPE}$ is determined the operating mode (MODE) is also determined by the processor. When $P_{TYPE}$ is determined to be alternating current (AC), the processor determines the MODE as power mode 620 since there is typically no reason to restrict the power to the apparatus except for testing purposes or at the discretion of the user. Preferably, when MODE is power mode, the processor signals the PMS to supply power to the connected apparatus for actively dissipating heat from a heat-generating device of the personal computer (e.g., processor) and continues to 625. When $P_{TYPE}$ is determined to be direct current (DC), the processor determines the MODE as conserve mode 640. In a preferred embodiment, the power supply detection feature within the PMS identifies whether supplied power to the computer is alternating (AC) or direct current (DC) and notifies the processor. Optionally, a power supply detector interconnected with the processor may be used to determine the power supply source type.

When MODE is power mode 620, the current required to operate the processor to efficiently remove heat generated by heat-generating components of the computer ($I_{REQ}$) is equated to the maximum current of the apparatus ($I_{APP}$) at 625. Power is then supplied from the PMS to the apparatus at 630 prior to increasing the operating speed of the processor to $v_{DESIRE}$ at 635. In this manner, heat-dissipation techniques are implemented prior to the maximum operation of the processor of the computer.

When MODE is conserve mode 640, the processor determines $I_{REQ}$ in relation to the apparatus heat-dissipation ability ($T_{APP}$) and the processor's heat-generating characteristics ($T_{GEN}$) given $v_{DESIRE}$ at 645. Additionally, the available current ($I_{AVAIL}$) is determined in relation to $P_{AVAIL}$ at 645. At 650, a determination of $I_{AVAIL}$ in relation to $I_{REQ}$ and $I_{APP}$ is performed.

If it is determined that $I_{AVAIL}$ is insufficient to operate the apparatus at the necessary-rate to achieve $T_{APP}$, or if the required heat-dissipation exceeds that available from the apparatus (e.g. $I_{REQ} > I_{APP}$), then a user is notified at 655 to select a lower operational speed at 660 or to deactivate the system 665. In an alternative embodiment, a default processing speed is determined from the determined power and current characteristics and this default frequency: is equated to $v_{DESIRE}$ at 665. If it is determined that $I_{AVAIL}$ is sufficient to operate the apparatus at the necessary rate to achieve $T_{APP}$, the process continues to step 670.

In step 670, the current required to operate the processor to efficiently remove heat generated by heat-generating components of the computer ($I_{REQ}$) is provided to the apparatus. It is preferred that the power be supplied by the processor controlling the PMS, however, other alternatives are envisioned by the inventor as well. The operating speed of the processor is increased to $v_{DESIRE}$ at 675. In this manner, heat-dissipation techniques are implemented prior to the maximum operation of the processor of the computer. A clock count is initiated at 680 to create a timed delay for iteratively determining actual junction temperature of the processor ($T_{JUNCT}$) in step 685.

$T_{JUNCT}$ is determined at 685 preferably by an analog temperature sensor coupled to an A/D converter interconnected with, the processor. The processor compares the digitally converted $T_{JUNCT}$ with the predetermined theoretical processor junction temperature at $V_{DESIRE}$ ($T_{ROC}$) at 690. Provided $T_{JUNCT}$ is less than $T_{PROC}$, the processor determines that the apparatus is effectively removing heat at a rate anticipated based upon the earlier determinations. In this situation (695), there is no need to after the power supplied to the apparatus and an additional temperature measurement of $T_{JUNCT}$ is planned for a predetermined future period based upon the clock counter at 680. When $T_{JUNCT}$ is greater than $T_{PROC}$ at 699, additional heat-dissipation is required and additional current may be required at the apparatus to increase the rate at which heat is dissipated. In this situation, a closed-loop control reevaluates pertinent power, current and temperature data to determine whether to increase power to the apparatus, decrease operational frequency of the processor, deactivate or another alternative approach, initiating at 645.

In a preferred embodiment, the apparatus is integrated with a personal computer docking device having power and connection ports operatively interconnected with the apparatus of the present invention such that the apparatus is controllably operable to remove excess heat energy generated by a processor of an docked personal computer.

In another preferred embodiment, the apparatus is operably connected with a personal computer to lower the temperature in heat-generating areas of a personal computer other than a processor to eliminate hot spots and effect a better temperature distribution as necessary, such as regulating the bottom-surface temperature of an otherwise hot system to a lower temperature and improved comfort level.

In another preferred embodiment, the present invention contains one or more software systems or software components of functions. In this context, a software system is a collection of one or more executable software programs, and one or more storage areas (for example RAM, ROM, cache, disk, flash memory, PCMCIA, CD-ROM. Server's Memory, ftp accessible memory, etc.). In general terms, a software system should be understood to comprise a fully functional software embodiment of a function or collection of functions, which can be added to an existing processing system to provide new function to that processing system. Software systems generally are constructed in a layered fashion such that a lowest level software system is usually the operating system which enables the hardware to execute software instructions.

A software system is thus understood to be a software implementation of a function which can be carried out in a processor system providing new functionality. Also, in general, the interface provided by one software system to another software system is well-defined. It should be understood in the context of the present invention that delineations between software systems are representative of the preferred implementation. However, the present invention may be implemented using any combination or separation of software or hardware systems.

The present invention may be implemented as circuit-based processes, including possible implementation on a single integrated circuit. As would be apparent to one skilled in the art, various functions of circuit elements may also be implemented in the digital domain as processing steps in a software program and may alternatively be provided using discrete components. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method for selectively optimizing operation of a portable cooling apparatus operably connected with a personal computer having a corresponding conductive connection in thermal contact with a heat-generating source within an ambient environment of the computer, comprising the steps of:

(a) determining power operational mode of processor in relation to power source, available power from the power source and planned operational speed of a processor of the personal computer --,--

(b) calculating apparatus power required for dissipating heat energy theoretically generated by the heat-generating source at the planned operational processor speed, (c) determining to provide power to apparatus when available power is greater than apparatus power required, or adjust planned operational speed of processor to operate within determined power characteristics and providing power accordingly thereafter, (d) measuring actual junction temperature of the processor and comparing actual temperature with that theoretically determined in step (b), and (e) adjusting the power to the apparatus in response to step (d) in relation to the determined power characteristics.

2. An article of manufacture a program product comprising a processor useable medium having a processor readable program embodied in said medium, wherein the processor readable program when executed on a processor causes the processor to:

(a) determine power operational mode of processor in relation to power source, available power from the power source and planned operational speed of a processor of the personal computer --,--

(b) calculate apparatus power required for dissipating heat energy theoretically generated by the heat-generating source at the planned operational processor speed, (c) determine to provide power to apparatus when available power is greater than apparatus power required, or adjust planned operational speed of processor to operate within determined power characteristics and providing power accordingly thereafter, (d) measure actual junction temperature of the processor and compare actual temperature with that theoretically determined in step (b), and (e) adjust the power to the apparatus in response to step (d) in relation to the determined power characteristics.

* * * * *